United States Patent
Han

(10) Patent No.: US 10,565,930 B2
(45) Date of Patent: Feb. 18, 2020

(54) POWER CONFIGURATION STRUCTURE AND METHOD FOR TOP-EMITTING AMOLED PANEL

(71) Applicant: Shenzhen China Star Optoelectronics Semiconductor Display Technology Co., Ltd., Shenzhen (CN)

(72) Inventor: Baixiang Han, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 103 days.

(21) Appl. No.: 15/580,279

(22) PCT Filed: Nov. 15, 2017

(86) PCT No.: PCT/CN2017/111005
§ 371 (c)(1),
(2) Date: Dec. 7, 2017

(87) PCT Pub. No.: WO2019/041570
PCT Pub. Date: Jul. 3, 2019

(65) Prior Publication Data
US 2019/0221161 A1    Jul. 18, 2019

(30) Foreign Application Priority Data
Aug. 28, 2017  (CN) .......................... 2017 1 0752802

(51) Int. Cl.
*G09G 3/3233* (2016.01)
*G09G 3/3258* (2016.01)
*H01L 27/32* (2006.01)

(52) U.S. Cl.
CPC ......... *G09G 3/3258* (2013.01); *G09G 3/3233* (2013.01); *H01L 27/3276* (2013.01);
(Continued)

(58) Field of Classification Search
CPC ......... G09G 3/3258; G09G 2320/0233; G09G 2300/0819; G09G 3/3233;
(Continued)

(56) References Cited

U.S. PATENT DOCUMENTS 9,418,597 B2    8/2016  Han
9,653,024 B1*   5/2017  Kuo .................... G09G 3/3233
(Continued)

FOREIGN PATENT DOCUMENTS

CN    101055697 A    10/2007
CN    103811519 A     5/2014
(Continued)

*Primary Examiner* — Xuemei Zheng
(74) *Attorney, Agent, or Firm* — Leong C. Lei

(57) ABSTRACT

The invention discloses a power configuration structure and method for top-emitting AMOLED panel. The structure comprises: a plurality of VDD electrodes, for inputting a high voltage power source to AMOLED panel pixel driver circuit, and a transparent cathode, for inputting a low voltage power source to the AMOLED panel pixel driver circuit, the transparent cathode being prepared by a planar vapor deposition process, VSS power input points being disposed on two opposite sides of the transparent cathode; the plurality of VDD electrodes being arranged in parallel with a direction perpendicular to the VSS power input points, each VDD electrode having two ends disposed with VDD power input points. The invention also provides a corresponding power configuration method. The power configuration structure and method of the invention combines a 3T1C driver circuit to effectively relieve the IR voltage drop caused by impedance increase of the transparent cathode to improve display.

13 Claims, 3 Drawing Sheets

(52) U.S. Cl.
CPC . *G09G 2300/0809* (2013.01); *G09G 2310/08* (2013.01); *G09G 2320/0223* (2013.01); *G09G 2330/00* (2013.01)

(58) Field of Classification Search
CPC ....... G09G 2300/0426; G09G 2330/00; G09G 2330/021; G09G 2320/0223; H01L 27/3276
See application file for complete search history.

(56) References Cited

U.S. PATENT DOCUMENTS

| | | | |
|---|---|---|---|
| 2009/0184899 A1* | 7/2009 | Kim | G09G 3/3208 345/76 |
| 2010/0177086 A1* | 7/2010 | Nakamura | G09G 3/3258 345/211 |
| 2012/0293481 A1* | 11/2012 | Chaji | G06F 3/038 345/212 |
| 2016/0086547 A1* | 3/2016 | Lebrun | G09G 3/3233 345/205 |

FOREIGN PATENT DOCUMENTS

| | | |
|---|---|---|
| CN | 104299569 A | 1/2015 |
| CN | 104464621 A | 3/2015 |
| CN | 104821152 A | 8/2015 |
| CN | 105185300 A | 12/2015 |
| CN | 107301843 A | 10/2017 |

\* cited by examiner

POWER CONFIGURATION STRUCTURE AND METHOD FOR TOP-EMITTING AMOLED PANEL

BACKGROUND OF THE INVENTION

1. Field of the Invention

The present invention relates to the field of display techniques, and in particular to a power configuration structure and method for top-emitting AMOLED panel.

2. The Related Arts

The organic light-emitting diode (OLED) has the advantages of low power consumption, wide color gamut, high brightness, high resolution, wide viewing angle, and fast response time, and attracts much attention.

The driving types of OLED can be divided, according to the driving method, into the passive matrix OLED (PMOLED) and active matrix OLED (AMOLED); wherein the AMOLED provides the advantages of pixels arranged in an array, self-luminous, and high luminous efficiency and is commonly used for high definition large-size display. Based on the light-emission direction, the OLED can be either bottom-emitting type or top-emitting type. An OLED element is commonly structured as a stack of, from bottom to top, anode, planarization layer, organic material layer, and transparent cathode. The light emitted from the top of the element for top-emitting OLED, and has a higher aperture ratio.

The large-size high-resolution AMOLED panel is the trend. As the resolution increases, the aperture area of the bottom-emitting AMOLED is greatly restricted. Hence, the development of top-emitting structure is imperative. The current transparent cathode has a high impedance, resulting in serious IR drop.

Refer to FIG. 1. FIG. 1 is a known power configuration structure for top-emitting AMOLED panel. In the known power configuration structure for top-emitting AMOLED panel, the transparent cathode 1 is prepared by a planar vapor deposition process. The upper and lower of the transparent cathode 1 are disposed with VSS power input point 2, and the VSS voltage is inputted through the VSS power input point 2; the VDD electrode 3 is vertically distributed with the upper and lower sides disposed with VDD power input point 4, and the VDD voltage is inputted through VDD power input point 4. Due to the high impedance of the transparent cathode 1, usually with square resistance >10Ω/□, the above power configuration approach results in obvious brightness difference for the upper, lower sides and center of the panel caused by the IR voltage drop and display quality is affected.

Refer to FIG. 2. FIG. 2 shows a known AMOLED 3T1C pixel circuit, comprising: three thin film transistor (TFTs) T1-T3 and a capacitor Cst. The driving process of the pixel circuit is controlled by the scan signal Scan for timing sequence, and the TFT T1 is the driving TFT for driving the OLED by controlling the current flowing through the OLED. To match the operation of the pixel circuit, the high voltage power source VDD and low voltage power source VSS must be supplied. The low voltage power source VSS inputs from the cathode side of the OLED element, and the high voltage power source VDD inputs from the anode side of the OLED element through the driving TFT T1.

The known AMOLED 3T1C pixel circuit operates as follows: When Scan is at high voltage, T2 and T3 are turned on, the data signal Data is written into node G, the reference voltage Ref(<OLED activation voltage) is written into node S, and Vgs=Data−Ref. At this point, OLED does not emit light. When Scan is at low voltage, T2 and T3 are cut-off, node S is charged to $V_{Anode}$ by the high voltage power source VDD, node G is coupled to Data+$V_{Anode}$−Ref. At this point, Vgs=Data−Ref, and the OLED starts to emit light. T1, as the driving TFT, needs to operate in the saturation zone, in other words, must satisfy Vgs−Vth<VDD−$V_{Anode}$, where Vth is the threshold voltage of T1. If the low voltage power source VSS is limited by the high impedance of the transparent cathode and a larger IR voltage drop occurs, the VSS rises and causes the $V_{Anode}$ to rise, resulting in T1 operating in the linear zone, or $V_{Anode}$>VDD, the current pixel circuit is rendered failed. Due to circuit failure, the VDD voltage must be raised to make the T1 return to saturation zone. However, the overall raise of VDD will increase power consumption.

SUMMARY OF THE INVENTION

The object of the present invention is to provide a power configuration structure for top-emitting AMOLED panel, to relieve the IR voltage drop caused by the impedance increase of the transparent cathode.

Another object of the present invention is to provide a power configuration method for top-emitting AMOLED panel, to relieve the IR voltage drop caused by the impedance increase of the transparent cathode.

To achieve the above object, the present invention provides a power configuration structure for top-emitting AMOLED panel, which comprises: a plurality of VDD electrodes, for inputting a high voltage power source to AMOLED panel pixel driver circuit, and a transparent cathode, for inputting a low voltage power source to the AMOLED panel pixel driver circuit, the transparent cathode being prepared by a planar vapor deposition process, VSS power input points being disposed on two opposite sides of the transparent cathode; the plurality of VDD electrodes being arranged in parallel with a direction perpendicular to the VSS power input points, each VDD electrode having two ends disposed with VDD power input points.

According to a preferred embodiment of the present invention, the VSS power input points are disposed at the upper and lower sides of the transparent cathode, and the plurality of VDD electrodes are laterally distributed in parallel.

According to a preferred embodiment of the present invention, the VSS power input points are disposed at the left and right sides of the transparent cathode, and the plurality of VDD electrodes are vertically distributed in parallel.

According to a preferred embodiment of the present invention, each VDD electrode inputs different VDD voltage according to a voltage at location of corresponding transparent cathode.

According to a preferred embodiment of the present invention, by configuring the VDD voltage inputted by each VDD electrode, the difference between the high voltage power source and low voltage power source at each area of the AMOLED panel keeps consistent.

According to a preferred embodiment of the present invention, the AMOLED panel pixel driver circuit comprises:

a first thin film transistor (TFT), having a gate connected to a first node, a source and a drain connected respectively to a second node and the high voltage power source;

a second TFT, having a gate connected to a scan signal, a source and a drain connected respectively to the first node and a data signal;

a third TFT, having a gate connected to the scan signal, a source and a drain connected respectively to the second node and a reference voltage;

a capacitor, having two ends connected respectively to the first node and the second node;

an OLED, having an anode connected to the second node, and a cathode connected to a low voltage power source;

wherein the reference voltage being less than activation voltage of the OLED.

According to a preferred embodiment of the present invention, the scan signal has timing sequence configured for a compensation phase and a light-emitting phase.

According to a preferred embodiment of the present invention, in the compensation phase, the scan signal is at high voltage.

According to a preferred embodiment of the present invention, in the light-emitting phase, the scan signal is at low voltage.

The present invention also provides a power configuration method for the aforementioned top-emitting AMOLED panel, which comprises: each VDD electrode inputting different VDD voltage according to a voltage at location of corresponding transparent cathode; by configuring the VDD voltage inputted by each VDD electrode, the difference between the high voltage power source and low voltage power source at each area of the AMOLED panel keeping consistent.

The present invention also provides a power configuration structure for top-emitting AMOLED panel, which comprises: a plurality of VDD electrodes, for inputting a high voltage power source to AMOLED panel pixel driver circuit, and a transparent cathode, for inputting a low voltage power source to the AMOLED panel pixel driver circuit, the transparent cathode being prepared by a planar vapor deposition process, VSS power input points being disposed on two opposite sides of the transparent cathode; the plurality of VDD electrodes being arranged in parallel with a direction perpendicular to the VSS power input points, each VDD electrode having two ends disposed with VDD power input points;

wherein each VDD electrode inputting different VDD voltage according to a voltage at location of corresponding transparent cathode;

wherein by configuring the VDD voltage inputted by each VDD electrode, the difference between the high voltage power source and low voltage power source at each area of the AMOLED panel keeping consistent;

wherein the AMOLED panel pixel driver circuit comprising:

a first thin film transistor (TFT), having a gate connected to a first node, a source and a drain connected respectively to a second node and the high voltage power source;

a second TFT, having a gate connected to a scan signal, a source and a drain connected respectively to the first node and a data signal;

a third TFT, having a gate connected to the scan signal, a source and a drain connected respectively to the second node and a reference voltage;

a capacitor, having two ends connected respectively to the first node and the second node;

an OLED, having an anode connected to the second node, and a cathode connected to a low voltage power source;

wherein the reference voltage being less than activation voltage of the OLED;

wherein the scan signal having timing sequence configured for a compensation phase and a light-emitting phase.

In summary, the power configuration structure and method for top-emitting AMOLED panel of the present invention combines a 3T1C driver circuit to effectively relieve the IR voltage drop caused by impedance increase of the transparent cathode and improve the display quality.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 3:
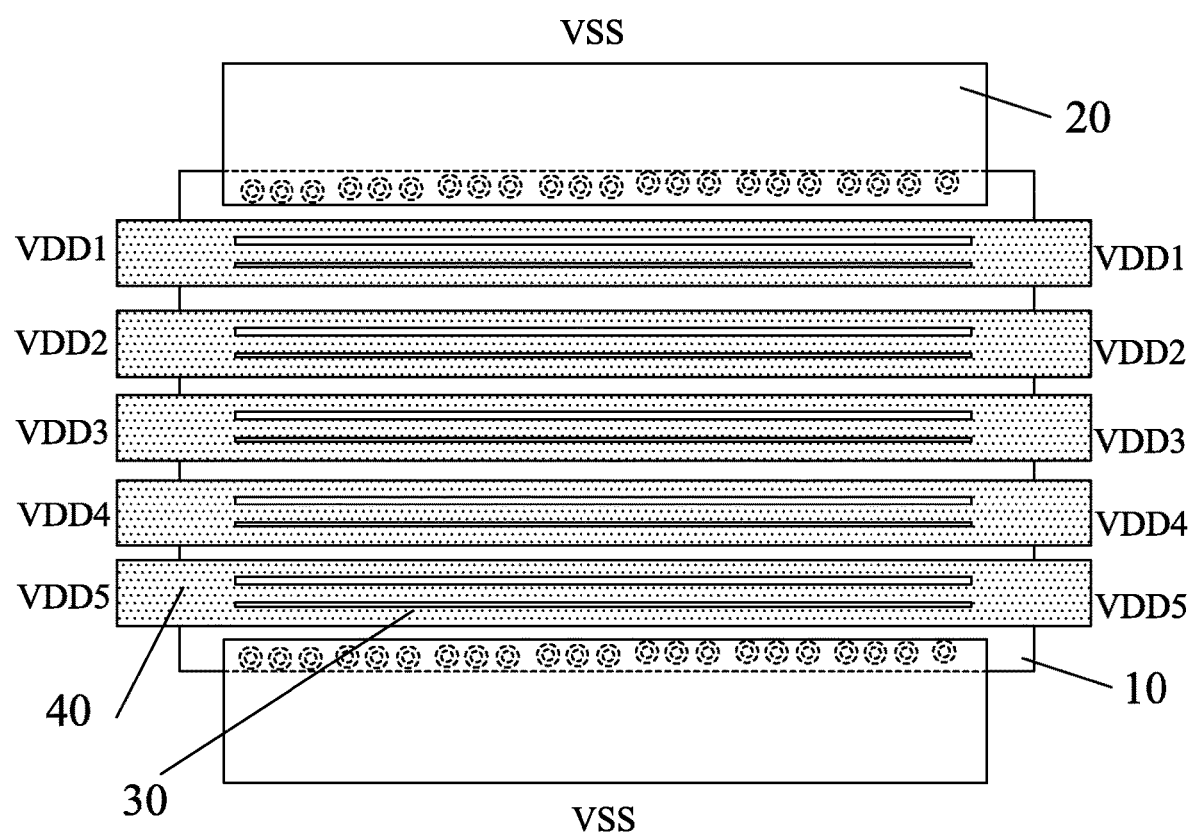
FIG. 3 is a schematic view showing the structure of a preferred embodiment of the power configuration for top-emitting AMOLED panel of the present invention.

Referring to FIG. 3, FIG. 3 is a schematic view showing the structure of a preferred embodiment of the power configuration for top-emitting AMOLED panel of the present invention. The preferred embodiment comprises: a plurality of VDD electrodes 30, for inputting a high voltage power source to AMOLED panel pixel driver circuit, and a transparent cathode 10, for inputting a low voltage power source to the AMOLED panel pixel driver circuit, the transparent cathode 10 being prepared by a planar vapor deposition process, VSS power input points 20 being disposed on two opposite sides of the transparent cathode 10; the plurality of VDD electrodes 30 being arranged in parallel with a direction perpendicular to the VSS power input points 20, each VDD electrode 30 having two ends disposed with VDD power input points 40. In the preferred embodiment, the VSS power input points 20 are disposed at the upper and lower sides of the transparent cathode 10, and the plurality of VDD electrodes (VDD1-VDD5) 30 are laterally distributed in parallel. In other embodiment, the VSS power input points 20 are disposed at the left and right sides of the transparent cathode 10, and the plurality of VDD electrodes 30 are vertically distributed in parallel.

Each VDD electrode 30 inputs different VDD voltage according to a voltage at location of corresponding transparent cathode 10. In the preferred embodiment, the VDD voltages are distributed in five horizontal zones according to VDD1-VDD5, and the voltage of each of the VDD electrodes 30 in the lateral direction depends on the VSS voltage drop in the corresponding zone. By configuring the VDD voltage inputted by each VDD electrode 30, the difference between the high voltage power source and low voltage power source at each area of the AMOLED panel keeps consistent.

Figure 4:
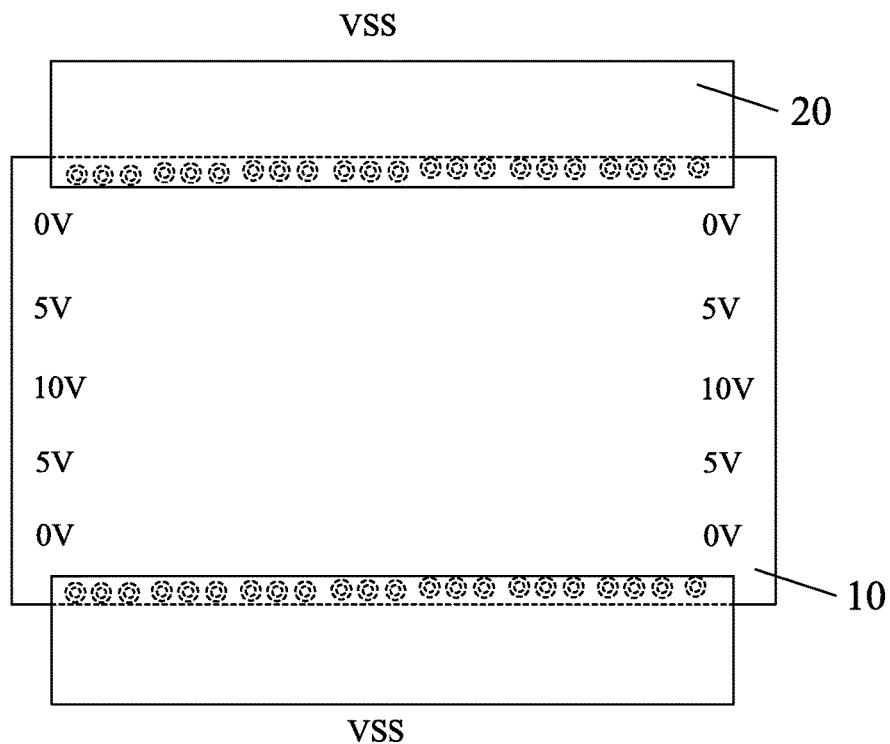
FIG. 4 is a schematic view showing the VSS voltage distribution for the preferred embodiment.
Figure 5:
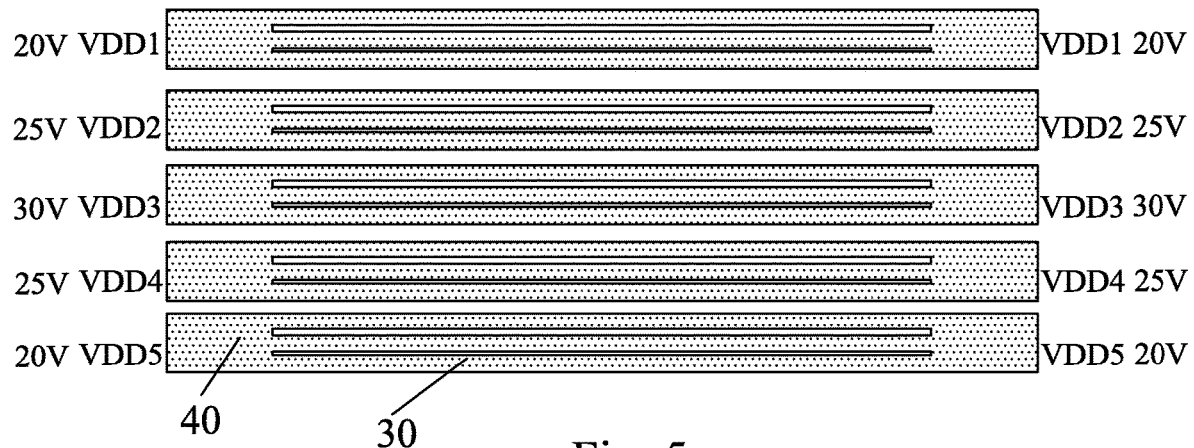
FIG. 5 is a schematic view showing the VDD voltage configuration for the preferred embodiment.

Refer to FIG. 4 and FIG. 5. FIG. 4 is a schematic view showing the VSS voltage distribution configuration for the preferred embodiment, depicting the voltage distribution after the VSS power source inputted to the transparent cathode 10 through the VSS power input points 20. FIG. 5 is a schematic view showing the VDD voltage configuration for the preferred embodiment, depicting the input of different VDD voltage to different VDD electrode 30 through VDD power input points 40 to match the VSS voltage distribution in FIG. 4. Assume that the initial voltage of VDD is 20V, the initial voltage of VSS is 0V, and the VSS IR voltage drop caused by the transparent cathode 10 is as shown in FIG. 4, then the VDD voltage allocation for corresponding VDD electrode 30 can be as shown in FIG. 5 so that the voltage difference (VDD-VSS) of driver circuit in each zone keeps consistent, without increasing driving power consumption while solving the IR voltage drop issue caused by impedance increase of transparent cathode. Theoretically, the higher the number of VDD zones is (i.e., the more the number of VDD electrodes 30), the better the result will be. However, the variation of the number VDD electrodes or the layout, such as, VDD electrodes 30 vertically disposed and VSS laterally disposed, is also within the scope of the present invention.

Figure 1:
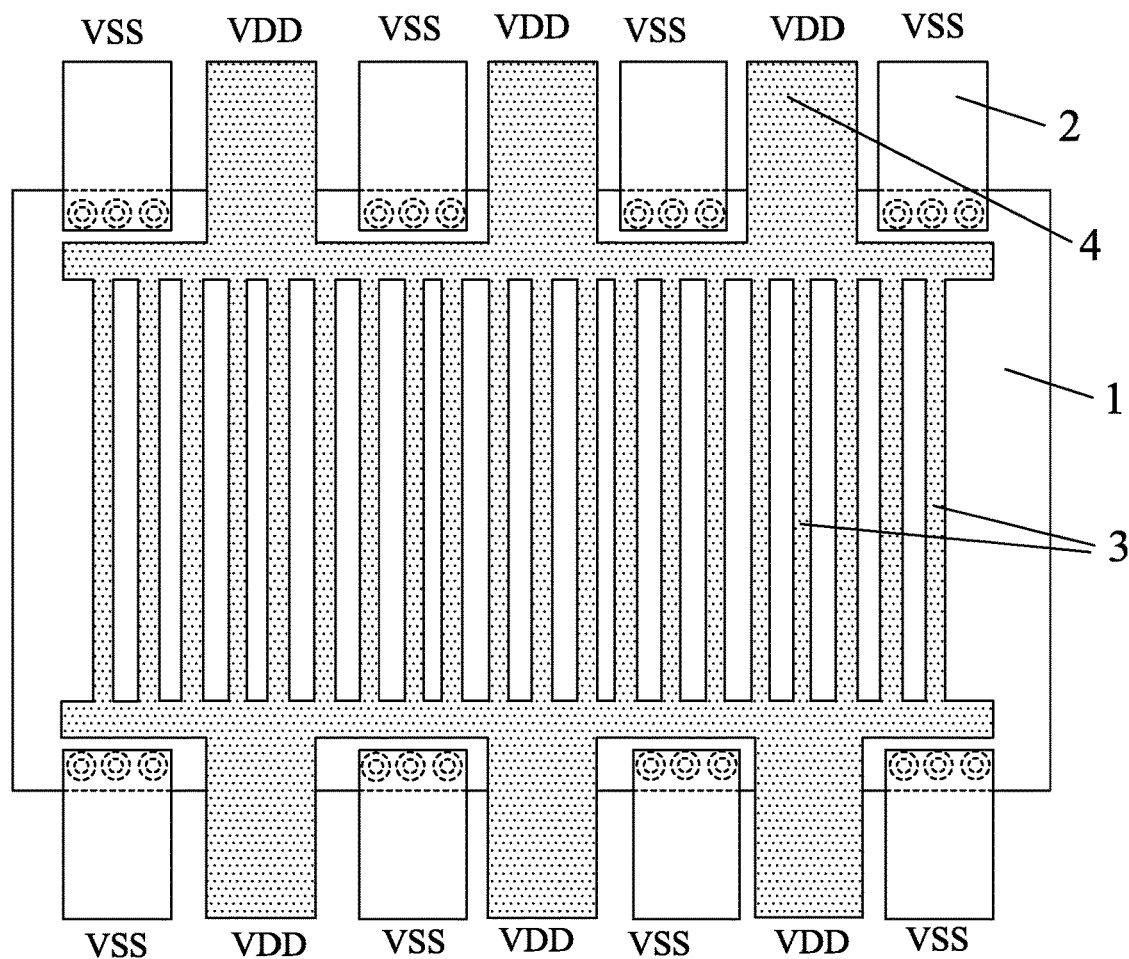
FIG. 1 is a schematic view showing a known power configuration structure for top-emitting AMOLED panel.
Figure 2:
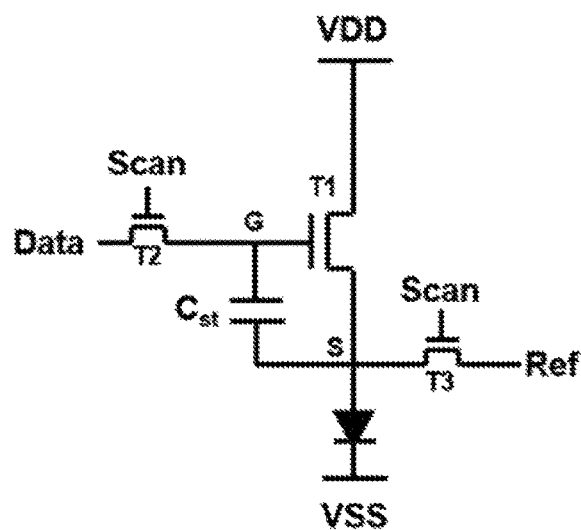
FIG. 2 is a schematic view showing a known 3T1C pixel circuit of AMOLED.

The power configuration structure and method for the top-emitting AMOLED panel of the present invention can be combined with the known pixel circuit, such as, the 3T1C circuit shown in FIG. 1, wherein: T1, having a gate connected to node G, a source and a drain connected respectively to node S and the high voltage power source VDD; T2, having a gate connected to scan signal Scan, a source and a drain connected respectively to node S and data signal Data; T3, having a gate connected to scan signal Scan, a source and a drain connected respectively to node S and reference voltage Ref; capacitor Cst, having two ends connected respectively to node G and node S; OLED, having an anode connected to node S, and a cathode connected to low voltage power source VSS; wherein the reference voltage Ref being less than activation voltage of the OLED. During operation, the scan signal Scan has timing sequence configured for a compensation phase and a light-emitting phase. In the compensation phase, the scan signal Scan is at high voltage; in the light-emitting phase, the scan signal Scan is at low voltage. The specific operation process can refer to the background section. Because the present invention uses specific power configuration structure and method for top-emitting AMOLED panel, combined with the common 3T1C driver circuit, to achieve effective relieving of IR voltage drop caused by impedance increase of the transparent cathode and improving display quality. The driving structure is simple to implement, and suitable for large-size top-emitting AMOLED panel. By combining the power configuration structure and method for top-emitting AMOLED panel of the present invention with the known driver circuit, the present invention can make the T1 return to the saturation zone to ensure the circuit to operate normally as well as solves the problem of relieving of IR voltage drop caused by impedance increase of the transparent cathode without increasing power consumption.

In summary, the power configuration structure and method for top-emitting AMOLED panel of the present invention combines a 3T1C driver circuit to effectively relieve the IR voltage drop caused by impedance increase of the transparent cathode and improve the display quality.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claim of the present invention.

What is claimed is:

1. A power configuration structure for top-emitting active matrix organic light-emitting diode (AMOLED) panel, which comprises: a plurality of VDD electrodes, for inputting a high voltage power source to AMOLED panel pixel driver circuit, and a transparent cathode, for inputting a low voltage power source to the AMOLED panel pixel driver circuit, the transparent cathode being prepared by a planar vapor deposition process, VSS power input points being disposed on two opposite sides of the transparent cathode that are opposite to and spaced from each other in a first direction; the plurality of VDD electrodes being arranged in parallel with a second direction that is perpendicular to the first direction in which the two opposite sides of the transparent cathode, on which the VSS power input points are disposed, are spaced from each other, the plurality of VDD electrodes being spaced from each other in the first direction, each VDD electrode having two ends disposed with VDD power input points;

wherein the VSS power input points are provided with a predetermined voltage and the transparent cathode comprises a continuous film comprising multiple integral parts that respectively exhibit voltage levels that are different from each other and are different from the predetermined voltage; and wherein the plurality of VDD electrodes input different VDD voltages according to the voltage levels of the multiple integral parts of the transparent cathode such that a difference between the high voltage power source and low voltage power source is kept consistent through the multiple integral parts of the transparent cathode.

2. The power configuration structure for top-emitting AMOLED panel as claimed in claim 1, wherein the VSS power input points are disposed at the upper and lower sides of the transparent cathode, and the plurality of VDD electrodes are laterally distributed in parallel.

3. The power configuration structure for top-emitting AMOLED panel as claimed in claim 1, wherein the VSS power input points are disposed at the left and right sides of the transparent cathode, and the plurality of VDD electrodes are vertically distributed in parallel.

4. The power configuration structure for top-emitting AMOLED panel as claimed in claim 1, wherein the AMOLED panel pixel driver circuit comprises:

a first thin film transistor (TFT), having a gate connected to a first node, a source and a drain connected respectively to a second node and the high voltage power source;

a second TFT, having a gate connected to a scan signal, a source and a drain connected respectively to the first node and a data signal;

a third TFT, having a gate connected to the scan signal, a source and a drain connected respectively to the second node and a reference voltage;

a capacitor, having two ends connected respectively to the first node and the second node;

an OLED, having an anode connected to the second node, and a cathode connected to a low voltage power source;

wherein the reference voltage is less than activation voltage of the OLED.

5. The power configuration structure for top-emitting AMOLED panel as claimed in claim 4, wherein the scan signal has timing sequence configured for a compensation phase and a light-emitting phase.

6. The power configuration structure for top-emitting AMOLED panel as claimed in claim 5, wherein in the compensation phase, the scan signal is at high voltage.

7. The power configuration structure for top-emitting AMOLED panel as claimed in claim 5, wherein in the light-emitting phase, the scan signal is at low voltage.

8. A power configuration method for the power configuration structure for top-emitting AMOLED panel as claimed in claim 1.

9. A power configuration structure for top-emitting active matrix organic light-emitting diode (AMOLED) panel, which comprises: a plurality of VDD electrodes, for inputting a high voltage power source to AMOLED panel pixel driver circuit, and a transparent cathode, for inputting a low voltage power source to the AMOLED panel pixel driver circuit, the transparent cathode being prepared by a planar vapor deposition process, VSS power input points being disposed on two opposite sides of the transparent cathode that are opposite to and spaced from each other in a first direction; the plurality of VDD electrodes being arranged in parallel with a second direction that is perpendicular to the first direction in which the two opposite sides of the transparent cathode, on which the VSS power input points are disposed, are spaced from each other, the plurality of VDD electrodes being spaced from each other in the first direction, each VDD electrode having two ends disposed with VDD power input points;

wherein the VSS power input points are provided with a predetermined voltage and the transparent cathode comprises a continuous film comprising multiple integral parts that respectively exhibit voltage levels that are different from each other and are different from the predetermined voltage;

wherein the plurality of VDD electrodes input different VDD voltages according to the voltage levels of the multiple integral parts of the transparent cathode such that a difference between the high voltage power source and low voltage power source is kept consistent through the multiple integral parts of the transparent cathode;

wherein the AMOLED panel pixel driver circuit comprises:

a first thin film transistor (TFT), having a gate connected to a first node, a source and a drain connected respectively to a second node and the high voltage power source;

a second TFT, having a gate connected to a scan signal, a source and a drain connected respectively to the first node and a data signal;

a third TFT, having a gate connected to the scan signal, a source and a drain connected respectively to the second node and a reference voltage;

a capacitor, having two ends connected respectively to the first node and the second node;

an OLED, having an anode connected to the second node, and a cathode connected to a low voltage power source;

wherein the reference voltage is less than activation voltage of the OLED;

wherein the scan signal has a timing sequence configured for a compensation phase and a light-emitting phase.

10. The power configuration structure for top-emitting AMOLED panel as claimed in claim 9, wherein the VSS power input points are disposed at the upper and lower sides of the transparent cathode, and the plurality of VDD electrodes are laterally distributed in parallel.

11. The power configuration structure for top-emitting AMOLED panel as claimed in claim 9, wherein the VSS power input points are disposed at the left and right sides of the transparent cathode, and the plurality of VDD electrodes are vertically distributed in parallel.

12. The power configuration structure for top-emitting AMOLED panel as claimed in claim 9, wherein in the compensation phase, the scan signal is at high voltage.

13. The power configuration structure for top-emitting AMOLED panel as claimed in claim 9, wherein in the light-emitting phase, the scan signal is at low voltage.

* * * * *